United States Patent
Yang

(10) Patent No.: US 10,126,789 B2
(45) Date of Patent: Nov. 13, 2018

(54) TRANSFER MODULE AND ELECTRONIC DEVICE HAVING THE SAME

(71) Applicant: Fu-Jen Yang, Taipei (TW)

(72) Inventor: Fu-Jen Yang, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 15/379,487

(22) Filed: Dec. 15, 2016

(65) Prior Publication Data
US 2018/0120909 A1    May 3, 2018

(30) Foreign Application Priority Data

Nov. 1, 2016  (TW) .............................. 105135299 A

(51) Int. Cl.
G06F 1/18       (2006.01)
H01R 12/70      (2011.01)
H01R 12/73      (2011.01)
H05K 5/02       (2006.01)

(52) U.S. Cl.
CPC ............. G06F 1/187 (2013.01); G06F 1/189 (2013.01); H01R 12/7076 (2013.01); H01R 12/737 (2013.01); H05K 5/026 (2013.01)

(58) Field of Classification Search
CPC combination set(s) only.
See application file for complete search history.

(56) References Cited

U.S. PATENT DOCUMENTS

| | | | | |
|---|---|---|---|---|
| 9,229,496 B2* | 1/2016 | Cravens | ................. | G06F 1/187 |
| 2003/0147220 A1* | 8/2003 | Fairchild | ................. | G06F 1/184 |
| | | | | 361/726 |
| 2010/0172083 A1* | 7/2010 | Randall | ................ | G11B 33/126 |
| | | | | 361/679.31 |
| 2012/0002364 A1* | 1/2012 | Goodman | ................ | G06F 1/187 |
| | | | | 361/679.33 |
| 2012/0113582 A1* | 5/2012 | Hirano | .................... | G06F 1/187 |
| | | | | 361/679.33 |
| 2014/0016260 A1* | 1/2014 | Chang | ........................ | G06F 1/16 |
| | | | | 361/679.32 |
| 2015/0316964 A1* | 11/2015 | Albert | ..................... | G06F 1/187 |
| | | | | 361/679.36 |
| 2015/0359115 A1* | 12/2015 | Hirano | .................... | G06F 1/181 |
| | | | | 361/679.34 |
| 2016/0050787 A1* | 2/2016 | Fu | ........................ | H05K 7/1489 |
| | | | | 361/679.31 |
| 2016/0073545 A1* | 3/2016 | Cravens | ................. | G06F 1/187 |
| | | | | 361/679.32 |
| 2016/0085276 A1* | 3/2016 | Lieber | ..................... | G06F 1/187 |
| | | | | 361/679.31 |
| 2016/0291647 A1* | 10/2016 | Okamoto | ................ | G06F 1/187 |

* cited by examiner

Primary Examiner — Lisa Lea Edmonds
(74) Attorney, Agent, or Firm — JCIPRNET

(57) ABSTRACT

A transfer module adapted to an electronic device is provided. The electronic device includes a circuit board and a plurality of storage units. The transfer module includes a transfer plate and a supporting structure. The transfer plate has a plurality of plug portions, and the transfer plate is adapted to be connected to the circuit board. The supporting structure is connected to the transfer plate. The supporting structure is adapted to support the storage units, such that the storage units are plugged to the plug portions respectively and connected to the circuit board through the transfer plate.

14 Claims, 3 Drawing Sheets

TRANSFER MODULE AND ELECTRONIC DEVICE HAVING THE SAME

CROSS-REFERENCE TO RELATED APPLICATION

This application claims the priority benefit of Taiwan application serial no. 105135299, filed on Nov. 1, 2016. The entirety of the above-mentioned patent application is hereby incorporated by reference herein and made a part of this specification.

BACKGROUND OF THE INVENTION

Field of the Invention

The invention relates to a transfer module and an electronic device having the transfer module, and more particularly, to a transfer module performing transfer of a plurality of storage units and an electronic device having the transfer module.

Description of Related Art

With the rapid development of serial communication techniques, peripheral component interconnect express (PCIe) interfaces have become a new generation bus interface commonly used in computer systems owing to their high transmission rate.

According to the above, although a computer system (e.g., a personal computer host) is generally provided with many PCIe interfaces, usually not all of them will be used, which leads to a waste of internal configuration space of the computer system. On the other hand, although the PCIe interfaces disposed in the computer system may be connected to PCIe hard disks, a single PCIe interface can only be connected to a single hard disk, and thus the internal configuration space of the computer system still cannot be efficiently used.

SUMMARY OF THE INVENTION

The invention provides a transfer module and an electronic device which enable effective utilization of internal configuration space of the electronic device.

The transfer module of the invention is adapted to an electronic device. The electronic device includes a circuit board and a plurality of storage units. The transfer module includes a transfer plate and a supporting structure. The transfer plate has a plurality of plug portions and the transfer plate is adapted to be connected to the circuit board. The supporting structure is connected to the transfer plate. The supporting structure is adapted to support the storage units, such that the storage units are plugged to the plug portions respectively and connected to the circuit board through the transfer plate.

In one embodiment of the invention, the transfer plate has a signal connector and is adapted to be connected to the circuit board through the signal connector.

In one embodiment of the invention, the transfer plate has a connection interface and a signal connector. The signal connector connects to the connection interface, and the connection interface is plugged to the circuit board, such that the signal connector is electrically connected to the circuit board through the connection interface.

In one embodiment of the invention, the electronic device includes a power supply. The transfer plate has a power connector and is adapted to be connected to the power supply through the power connector.

In one embodiment of the invention, the electronic device includes a power supply. The transfer plate has a connection interface and a power connector. The power connector connects to the connection interface, and the connection interface is plugged to the circuit board, such that the power connector is electrically connected to the power supply through the connection interface and the circuit board.

In one embodiment of the invention, the supporting structure has an accommodation slot. The accommodation slot is aligned with the plug portions and is adapted to accommodate the storage units.

In one embodiment of the invention, the supporting structure has at least one partition in the accommodation slot. The at least one partition divides the accommodation slot into a plurality of accommodation spaces. The accommodation spaces are respectively aligned with the plug portions and are respectively adapted to accommodate the storage units.

The electronic device of the invention includes a circuit board, a plurality of storage units, and at least one transfer module. The transfer module includes a transfer plate and a supporting structure. The transfer plate has a plurality of plug portions, wherein the transfer plate is connected to the circuit board. The supporting structure is connected to the transfer plate, wherein the supporting structure supports the storage units, such that the storage units are plugged to the plug portions respectively and connected to the circuit board through the transfer plate.

In one embodiment of the invention, the transfer plate has a signal connector and is connected to the circuit board through the signal connector.

In one embodiment of the invention, the transfer plate has a connection interface and a signal connector. The signal connector connects to the connection interface, and the connection interface is plugged to the circuit board, such that the signal connector is electrically connected to the circuit board through the connection interface.

In one embodiment of the invention, the electronic device includes a power supply, wherein the transfer plate has a power connector and is connected to the power supply through the power connector.

In one embodiment of the invention, the electronic device includes a power supply, wherein the transfer plate has a connection interface and a power connector. The power connector connects to the connection interface, and the connection interface is plugged to the circuit board, such that the power connector is electrically connected to the power supply through the connection interface and the circuit board.

In one embodiment of the invention, the supporting structure has an accommodation slot. The accommodation slot is aligned with the plug portions and accommodates the storage units.

In one embodiment of the invention, the supporting structure has at least one partition in the accommodation slot. The at least one partition divides the accommodation slot into a plurality of accommodation spaces. The accommodation spaces are respectively aligned with the plug portions and respectively accommodate the storage units.

Based on the above, in the transfer module of the invention, the transfer plate has a plurality of plug portions. A plurality of storage units are plugged to the plug portions respectively and connected to the circuit board of the electronic device through the single transfer plate. Accordingly, compared to a conventional transfer plate which only allows a single storage unit to be plugged thereto and hence leads to inefficient use of internal space of the electronic device, the transfer module of the invention enables effective utilization of internal configuration space of the electronic device.

To make the aforementioned features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
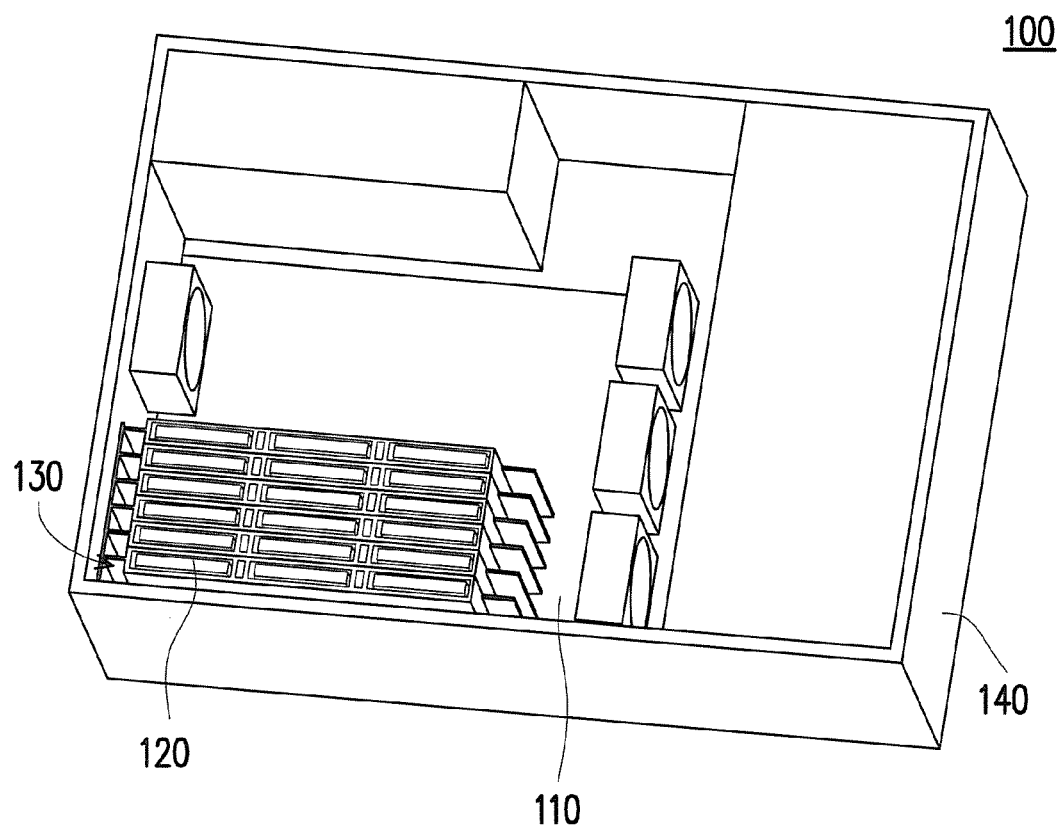
FIG. 1 is a perspective view of a part of components of an electronic device according to an embodiment of the invention.

FIG. 1 is a perspective view of a part of components of an electronic device according to an embodiment of the invention. Referring to FIG. 1, an electronic device 100 of the present embodiment includes a circuit board 110, a plurality of storage units 120, and at least one (depicted as six) transfer module 130. The electronic device 100 is, for example but not limited to, a personal computer host. The circuit board 110 is, for example but not limited to, a motherboard disposed inside a housing 140 of the electronic device 100. To make the drawing more clear, various elements on the circuit board 110 are omitted from illustration.

Each of the storage units 120 is, for example but not limited to, a hard disk having a serial advanced technology attachment (SATA) interface or integrated device electronics (IDE) interface. Each transfer module 130 is, for example, configured to connect to a peripheral component interconnect express (PCIe) interface on the circuit board 110 and transfer a corresponding storage unit 120 to the circuit board 110, but is not limited thereto.

Figure 2:
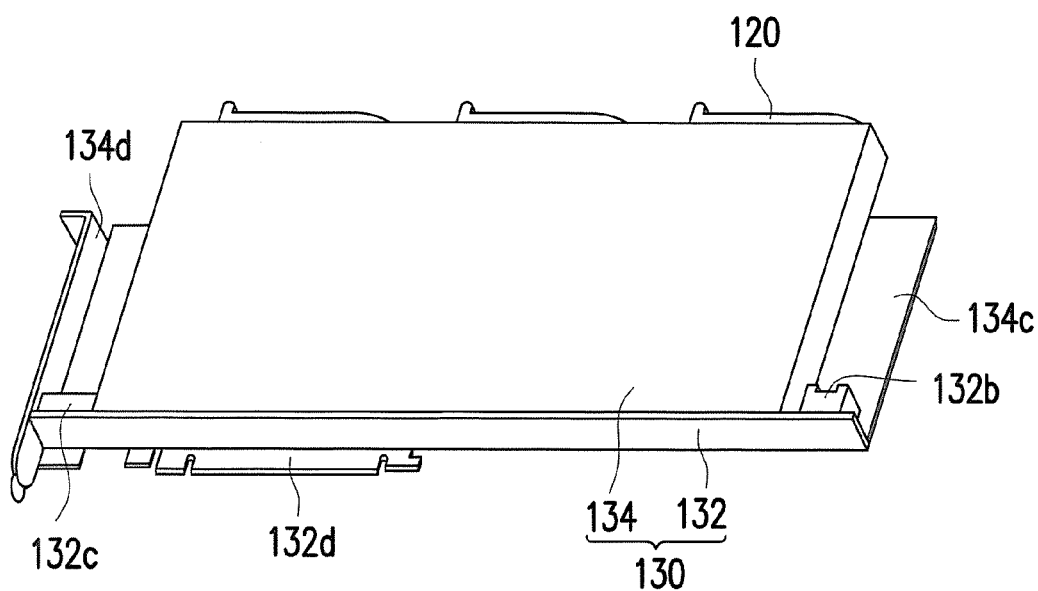
FIG. 2 is a perspective view of a transfer module and a storage unit of FIG. 1.
Figure 3:
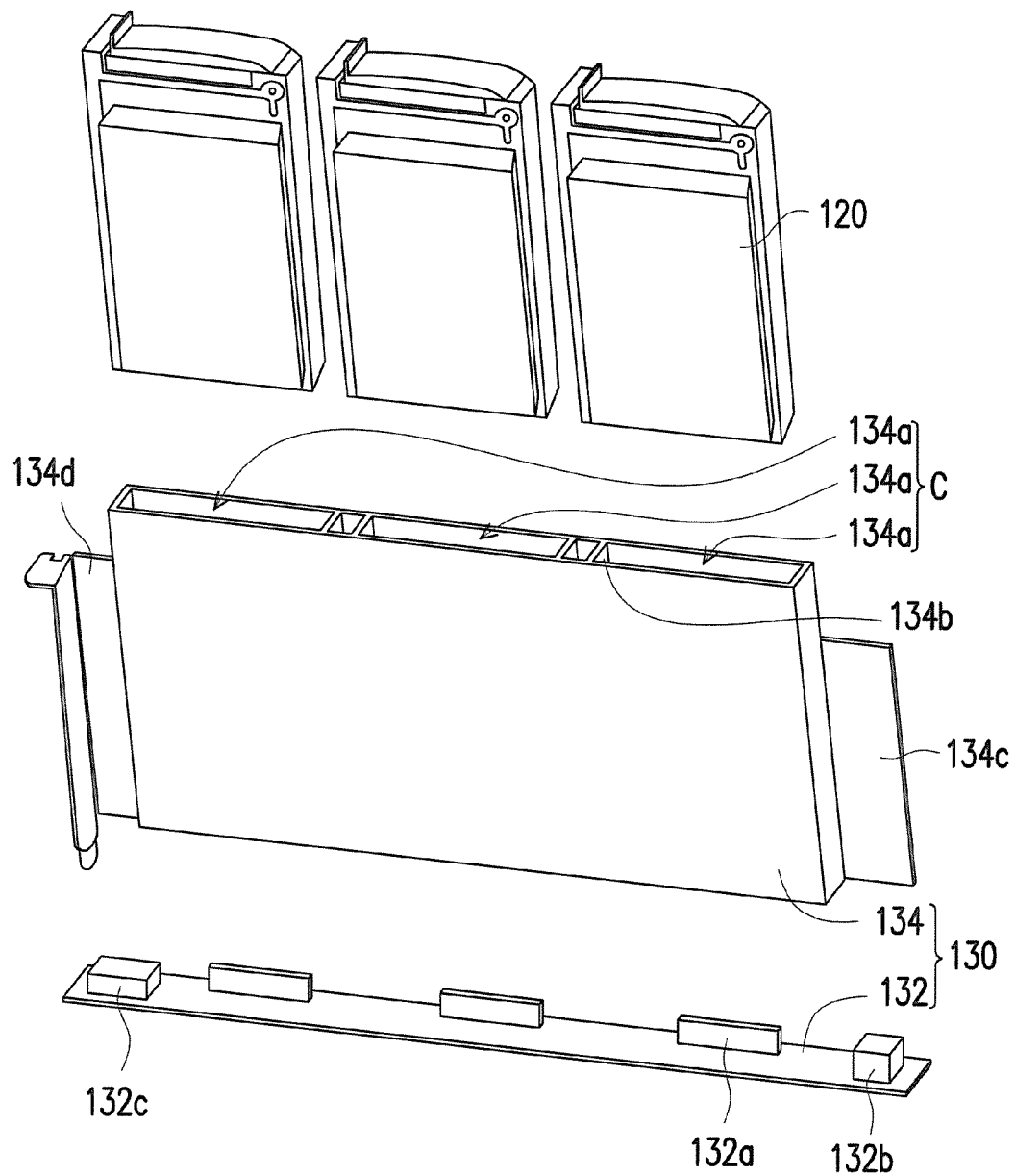
FIG. 3 is an exploded view of the transfer module and the storage unit of FIG. 2.

FIG. 2 is a perspective view of a transfer module and a storage unit of FIG. 1. FIG. 3 is an exploded view of the transfer module and the storage unit of FIG. 2. Please refer to FIG. 2 and FIG. 3. To be more specific, each transfer module 130 includes a transfer plate 132 and a supporting structure 134. The transfer plate 132 is connected to the circuit board 110 shown in FIG. 1, and has a plurality of (depicted as three) plug portions 132a. The supporting structure 134 is connected to the transfer plate 132. The supporting structure 134 is configured to support the storage units 120, such that the storage units 120 are plugged to the plug portions 132a respectively of the transfer plate 132 and are connected to the circuit board 110 shown in FIG. 1 through the transfer plate 132. In this embodiment, the transfer plate 132 and each of the plug portions 132a, for example, enable hot plugging of each of the storage units 120. The invention is not limited thereto.

Under the configuration mentioned above, the plurality of storage units 120 are plugged to the plurality of plug portions 132a respectively, and are connected to the circuit board 110 of the electronic device 100 through the single transfer plate 132. According to this, compared to a conventional transfer plate which only allows a single storage unit to be plugged thereto and hence leads to inefficient use of internal space of the electronic device, the transfer module 130 of the present embodiment enables effective utilization of internal configuration space of the electronic device 100. In other embodiments, the number of the plug portions 132a of the transfer plate 132 can be any other suitable number. The invention is not limited thereto.

The transfer plate 132 of the present embodiment, as shown in FIG. 2 and FIG. 3, has a signal connector 132b and is connected to the circuit board 110 shown in FIG. 1 through the signal connector 132b. The signal connector 132b and the circuit board 110 connect to each other through, for example, a signal line, a flat cable, or other suitable signal transmission medium. The invention is not limited thereto. In other embodiments, the signal connector 132b connects to a connection interface (e.g., PCIe interface) 132d of the transfer plate 132, and the connection interface 132d is plugged to the circuit board 110, such that the signal connector 132b is electrically connected to the circuit board 110 through the connection interface 132d.

Figure 4:
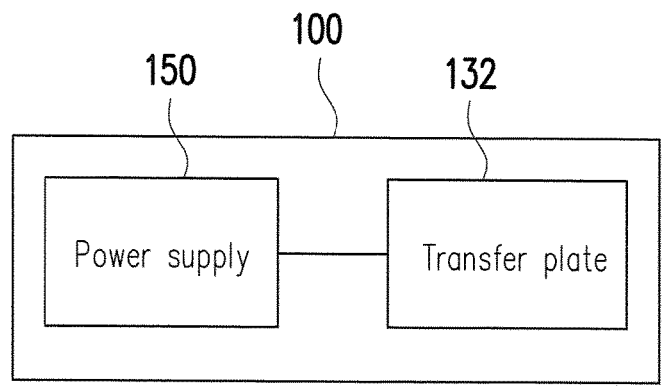
FIG. 4 is a block diagram of a part of components of the electronic device of FIG. 1.

FIG. 4 is a block diagram of a part of components of the electronic device of FIG. 1. The electronic device 100 of the present embodiment, as shown in FIG. 4, further includes a power supply 150. The transfer plate 132, as shown in FIG. 2 and FIG. 3, has a power connector 132c, and is connected to the power supply 150 through the power connector 132c. The power connector 132c and the power supply 150 connect to each other through, for example, a power cord or other suitable power transmission medium. The invention is not limited thereto. In other embodiments, the power connector 132c connects to the connection interface (e.g., PCIe interface) 132d of the transfer plate 132, and the connection interface 132d is plugged to the circuit board 110, such that the power connector 132c is electrically connected to the power supply 150 through the connection interface 132d and the circuit board 110.

Referring to FIG. 3, the supporting structure 134 of the present embodiment has an accommodation slot C. The accommodation slot C is aligned with the plug portions 132a of the transfer plate 132 and is configured to accommodate the storage units 120. To be more specific, the supporting structure 134 has at least one (depicted as a plurality of) partition 134b in the accommodation slot C. The partitions 134b divide the accommodation slot C into a plurality of accommodation spaces 134a. The accommodation spaces 134a are respectively aligned with the plug portions 132a and are respectively configured to accommodate the storage units 120. Besides, the supporting structure 134 of the present embodiment includes assembly portions 134c and 134d, and is assembled inside the housing 140 of the electronic device 100 in a screw locking manner via the assembly portions 134c and 134d. The transfer plate 132 is fixed between the supporting structure 134 and the circuit board 110 shown in FIG. 1. In other embodiments, the supporting structure 134 and the transfer plate 132 can be fixed inside the housing 140 of the electronic device 100 in other suitable manners. The invention is not limited thereto.

Figure 5:
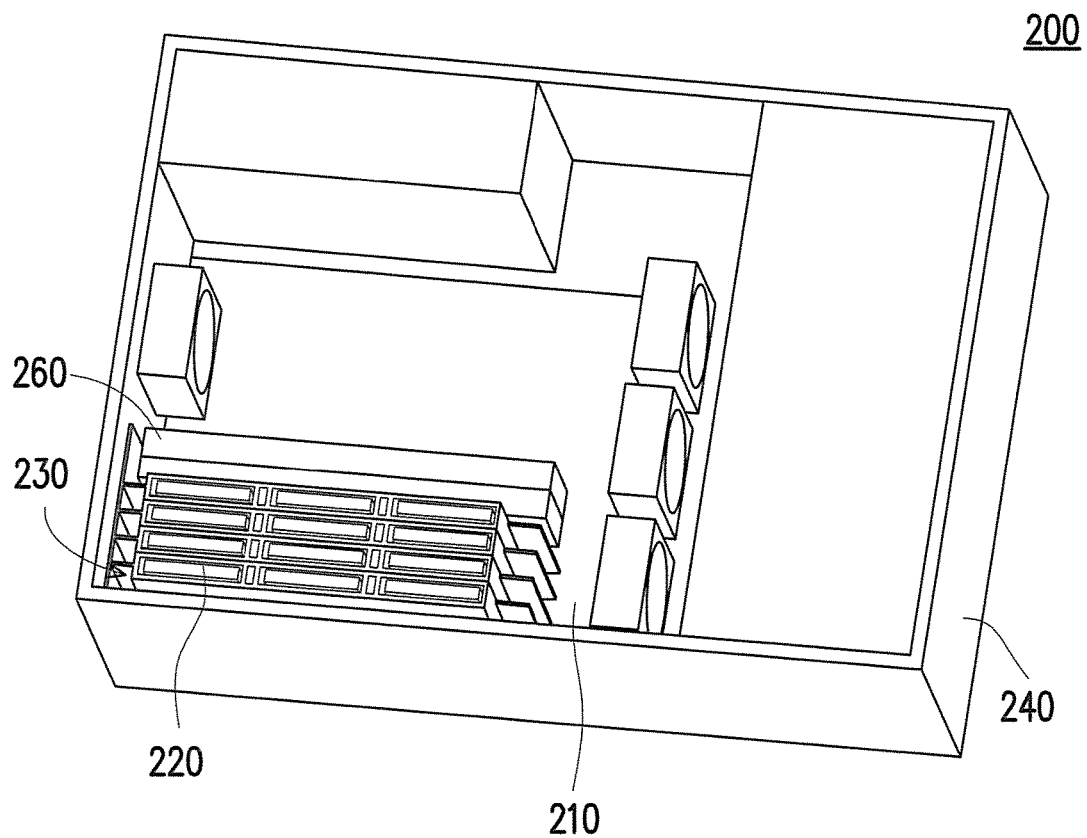
FIG. 5 is a perspective view of a part of components of the electronic device according to another embodiment of the invention.

FIG. 5 is a perspective view of a part of components of the electronic device according to another embodiment of the invention. In an electronic device 200 of FIG. 5, the arrangement and operation manners of a circuit board 210, a storage unit 220, a transfer module 230 and a housing 240 are similar to those of the circuit board 110, the storage unit 120, the transfer module 130 and the housing 140 in FIG. 1, and are not described in detail herein. The difference between the electronic device 200 and the electronic device 100 is that only four transfer modules 230 are disposed on the circuit board 210, while six transfer modules 130 are disposed on the circuit board 110 as shown in FIG. 1. Accordingly, the remaining slots (e.g., PCIe slots) on the circuit board 210 may allow plugging of other corresponding electronic components 260 (e.g., a network card, a display card, or other electronic component having a PCIe interface). In other embodiments, the number of the transfer module on the circuit board can be determined based on needs. The invention is not limited thereto.

In summary of the above, in the transfer module in the invention, the transfer plate has a plurality of plug portions. A plurality of storage units are plugged to the plug portions respectively and connected to the circuit board of the electronic device through the single transfer plate. Accordingly, compared to a conventional transfer plate which only allows a single storage unit to be plugged thereto and hence leads to inefficient use of internal space of the electronic device, the transfer module of the invention enables effective utilization of internal configuration space of the electronic device.

Although the invention has been disclosed by the embodiments as above, the embodiments are not intended to limit the invention. People having ordinary skill in the art can make some changes and modifications without departing from the spirit and the scope of the invention. Therefore, the protected scope of the invention shall be defined by the attached claims.

What is claimed is:

1. A transfer module, adapted to an electronic device, the electronic device comprising a circuit board and a plurality of storage units, and the transfer module comprising:
   a transfer plate, having a plurality of plug portions, wherein the transfer plate is connected to the circuit board; and
   a supporting structure, connected to the transfer plate, wherein the supporting structure is adapted to support the storage units, such that the storage units are plugged to the plug portions respectively and connected to the circuit board through the transfer plate,
   wherein the transfer plate has a connection interface plugged to the circuit board.

2. The transfer module of claim 1, wherein the transfer plate has a signal connector and is adapted to be connected to the circuit board through the signal connector.

3. The transfer module of claim 1, wherein the transfer plate has a signal connector, the signal connector connects to the connection interface, such that the signal connector is electrically connected to the circuit board through the connection interface.

4. The transfer module of claim 1, wherein the electronic device comprises a power supply, and the transfer plate has a power connector and is adapted to be connected to the power supply through the power connector.

5. The transfer module of claim 1, wherein the electronic device comprises a power supply, the transfer plate has a power connector, the power connector connects to the connection interface, such that the power connector is electrically connected to the power supply through the connection interface and the circuit board.

6. The transfer module of claim 1, wherein the supporting structure has an accommodation slot, and the accommodation slot is aligned with the plug portions and adapted to accommodate the storage units.

7. The transfer module of claim 6, wherein the supporting structure has at least one partition in the accommodation slot, the at least one partition divides the accommodation slot into a plurality of accommodation spaces, and the accommodation spaces are respectively aligned with the plug portions and are respectively adapted to accommodate the storage units.

8. An electronic device, comprising:
   a circuit board and a plurality of storage units; and
   at least one transfer module, comprising:
      a transfer plate, having a plurality of plug portions, wherein the transfer plate is connected to the circuit board; and
      a supporting structure, connected to the transfer plate, wherein the supporting structure supports the storage units, such that the storage units are plugged to the plug portions respectively and connected to the circuit board through the transfer plate,
   wherein the transfer plate has a connection interface plugged to the circuit board.

9. The electronic device of claim 8, wherein the transfer plate has a signal connector and is connected to the circuit board through the signal connector.

10. The electronic device of claim 8, wherein the transfer plate has a signal connector, the signal connector connects to the connection interface, such that the signal connector is electrically connected to the circuit board through the connection interface.

11. The electronic device of claim 8, comprising a power supply, wherein the transfer plate has a power connector and is connected to the power supply through the power connector.

12. The electronic device of claim 8, comprising a power supply, wherein the transfer plate has a power connector, the power connector connects to the connection interface, such that the power connector is electrically connected to the power supply through the connection interface and the circuit board.

13. The electronic device of claim 8, wherein the supporting structure has an accommodation slot, and the accommodation slot is aligned with the plug portions and accommodates the storage units.

14. The transfer module of claim 13, wherein the supporting structure has at least one partition in the accommodation slot, the at least one partition divides the accommodation slot into a plurality of accommodation spaces, and the accommodation spaces are respectively aligned with the plug portions and respectively accommodate the storage units.

* * * * *